United States Patent [19]

Erpelding et al.

[11] Patent Number: 5,606,477

[45] Date of Patent: Feb. 25, 1997

[54] VISCOELASTICALLY DAMPED SLIDER SUSPENSION SYSTEM

[75] Inventors: A. David Erpelding; Oscar J. Ruiz, both of San Jose, Calif.

[73] Assignee: International Business Machines Corporation, Armonk, N.Y.

[21] Appl. No.: 515,936

[22] Filed: Aug. 16, 1995

Related U.S. Application Data

[63] Continuation of Ser. No. 213,913, Mar. 15, 1994, abandoned.

[51] Int. Cl.⁶ ........................................................ G11B 5/48
[52] U.S. Cl. ............................................................ 360/104
[58] Field of Search ...................................... 360/103, 104

[56] References Cited

U.S. PATENT DOCUMENTS

| | | | |
|---|---|---|---|
| 4,543,295 | 9/1985 | St. Clair et al. | 428/458 |
| 4,760,478 | 7/1988 | Pal et al. | 360/104 |
| 4,761,699 | 8/1988 | Ainslie et al. | 360/103 |
| 4,839,232 | 6/1989 | Morita et al. | 428/473.5 |
| 4,937,133 | 6/1990 | Watanabe et al. | 428/209 |
| 4,991,045 | 2/1991 | Oberg | 360/104 |
| 4,996,623 | 2/1991 | Erpelding et al. | 360/104 |
| 5,126,904 | 6/1992 | Sakurai | 360/104 |

FOREIGN PATENT DOCUMENTS

| | | | |
|---|---|---|---|
| 0487914 | 6/1992 | European Pat. Off. | 360/104 |
| 0568257 | 11/1993 | European Pat. Off. | 360/103 |
| 53-30310 | 3/1978 | Japan . | |
| 01-248372 | 3/1989 | Japan . | |
| 01189083 | 7/1989 | Japan . | |
| 02-218078 | 8/1990 | Japan . | |
| 03-91173 | 4/1991 | Japan . | |
| 03-278382 | 12/1991 | Japan . | |
| 4219618 | 8/1992 | Japan . | |
| 5-36048 | 2/1993 | Japan | 360/103 |
| 2193833 | 2/1988 | United Kingdom . | |
| WO92/13345 | 8/1992 | WIPO . | |

OTHER PUBLICATIONS

E. M. Kerwin, "Damping of Flexural Waves by a Constrained Viscoelastic Layer," The Journal of the Acoustical Society of America, vol. 31, pp. 952–962 (1959).

Anonymous disclosure, "Circuitized Suspension Flexure–Foliage for Disk Drives," Published in Research Disclosure, No. 339, Kenneth Mason Publications Ltd, England (Jul. 1992).

Cooper et al., "Constrained Layer Damper Spring Assemblies," IBM Technical Disclosure Bulletin, vol. 33, No. 8, pp. 373–374 (Jan. 1991).

C. E. Yeack–Scranton, "PVF₂Resonance Damping For Magnetic Recording," IBM Technical Disclosure Bulletin, vol. 28, No. 12, pp. 5611–5613 (May 1986).

J. H. Nayak, "Auxiliary Mass Damping of DIsk–File Sliders," IBM Technical Disclosure Bulletin, vol. 26, No. 6, pp. 2922–2923 (Nov. 1983).

R. Plunkett and C. T. Lee, "Length Optimization for Constrained Viscoelastic Layer Damping," The Journal of the Acoustical Society of America, vol. 48, pp. 150–161 (1970).

F. Maseeh and S. Senturia, "Viscoelasticity and Creep Recovery of Polyimide Thin Films," VLSI Memo 90–600, MIT (Jun. 1990).

*Primary Examiner*—Stuart S. Levy
*Assistant Examiner*—William J. Klimowicz
*Attorney, Agent, or Firm*—Donald J. Pagel

[57] ABSTRACT

A slider suspension system for use in a magnetic recording disk file comprised of a laminated suspension positioned between an actuator arm and a read/write slider. The laminate is comprised of a copper alloy conductor layer, a polyimide dielectric layer and a stainless steel stiffener layer. A pattern of land areas are etched in the conductor layer and act as constraining areas for the viscoelastic dielectric layer. The constrained layer/constraining layer configuration damps vibrations existing in the suspension system.

15 Claims, 4 Drawing Sheets

VISCOELASTICALLY DAMPED SLIDER SUSPENSION SYSTEM

This is a continuation of Ser. No. 08/213,913, filed Mar. 15, 1994 now abandoned.

TECHNICAL FIELD

The present invention relates to a suspension system for the slider in a disk drive and more particularly to a laminated suspension system having a pattern etched into one of the laminated layers for creating constrained areas that facilitate damping of various vibrational modes in the system.

BACKGROUND ART

Magnetic recording disk files that utilize a transducer mounted on a slider for reading and/or writing data on at least one rotatable disk are well-known in the art. In such systems, the slider is typically attached to an actuator arm by a suspension system.

The use of laminated materials for constructing slider suspension systems in magnetic disk files is also known in the art. For example, Erpelding et al., in U.S. Pat. No. 4,996,623, issued Feb. 26, 1991, disclose a suspension system comprised of a sheet of polyimide material sandwiched between two metal layers. Similarly, Ainslie et al., in U.S. Pat. No. 4,761,699, issued Aug. 2, 1988, disclose a slider attached to a laminated suspension.

It is known that vibration of the arm and suspension in disk drives produces undesirable effects such as nonrepeatable runout of the recording element on the slider. One known approach to reducing such vibration is to incorporate a viscoelastic material into the suspension system that supports the slider. For example, Pal et al., in U.S. Pat. No. 4,760,478, issued Jul. 26, 1988, disclose a magnetic head support arm having a layer of viscoelastic material fixed to the load bearing member for damping vibrations in the support arm.

In analyzing the problem of unwanted vibrations in generalized systems, theoretical models have been developed for using a constrained layer and a constraining layer to damp the vibrations. These models indicate that the effectiveness of the overall damping obtained depends on the stiffness of the constrained layer as well as on its length. The appropriate length can be estimated in several ways, and both analytical and experimental methods have been used. For example, in a paper entitled "Damping of Flexural Waves by a Constrained Viscoelastic Layer," The Journal of the Acoustical Society of America, vol. 31 (1959), by E. M. Kerwin, the effective length of the constrained layer is related to the wavelength of bending waves.

In another paper, entitled "Length Optimization for Constrained Viscoelastic Layer Damping," The Journal of the Acoustical Society of America, vol. 48 (1970), by R. Plunkett and C. T. Lee, an effective constraining layer length is determined for single and multiple damping layers. In another paper, entitled "Viscoelasticity and Creep Recovery of Polyimide Thin Films," VLSI Memo 90-600, MIT (June 1990) by F. Maseeh and S. Senturia, the viscoelastic properties of thin polyimide films are characterized and measured.

None of the prior art discloses using the constrained layer/constraining layer principles to solve the problem of unwanted vibrations in slider suspensions for magnetic disk drives. Furthermore, as the track density of information storage media, like hard magnetic disks, increases, the need for slider suspension systems that reduce vibrations to a minimum continues to grow in importance.

SUMMARY OF THE PRESENT INVENTION

Briefly, the preferred embodiment of the present invention is a slider suspension system for use in a magnetic recording disk file that utilizes a constrained layer/constraining layer design to damp vibrations existing in the suspension system. The system includes a laminated suspension for attachment between the slider and the actuator arm, comprised of a conductor layer, a dielectric layer and a stiffener layer. The dielectric layer is comprised of a material that exhibits some viscoelastic properties, like a polyimide, and functions as the constrained layer to damp vibrations arising in the stiffener layer. The conductor layer includes a pattern of land areas that act as constraining areas for the dielectric layer.

In an alternative embodiment of the present invention, a V-shaped tongue is formed in the conductor layer and stiffener layer. The tongue allows the polyimide dielectric layer to undergo stretching and shear, thereby damping bending and torsional modes of vibration experienced by the suspension system.

DETAILED DESCRIPTION OF THE PREFERRED EMBODIMENT

Figure 1:
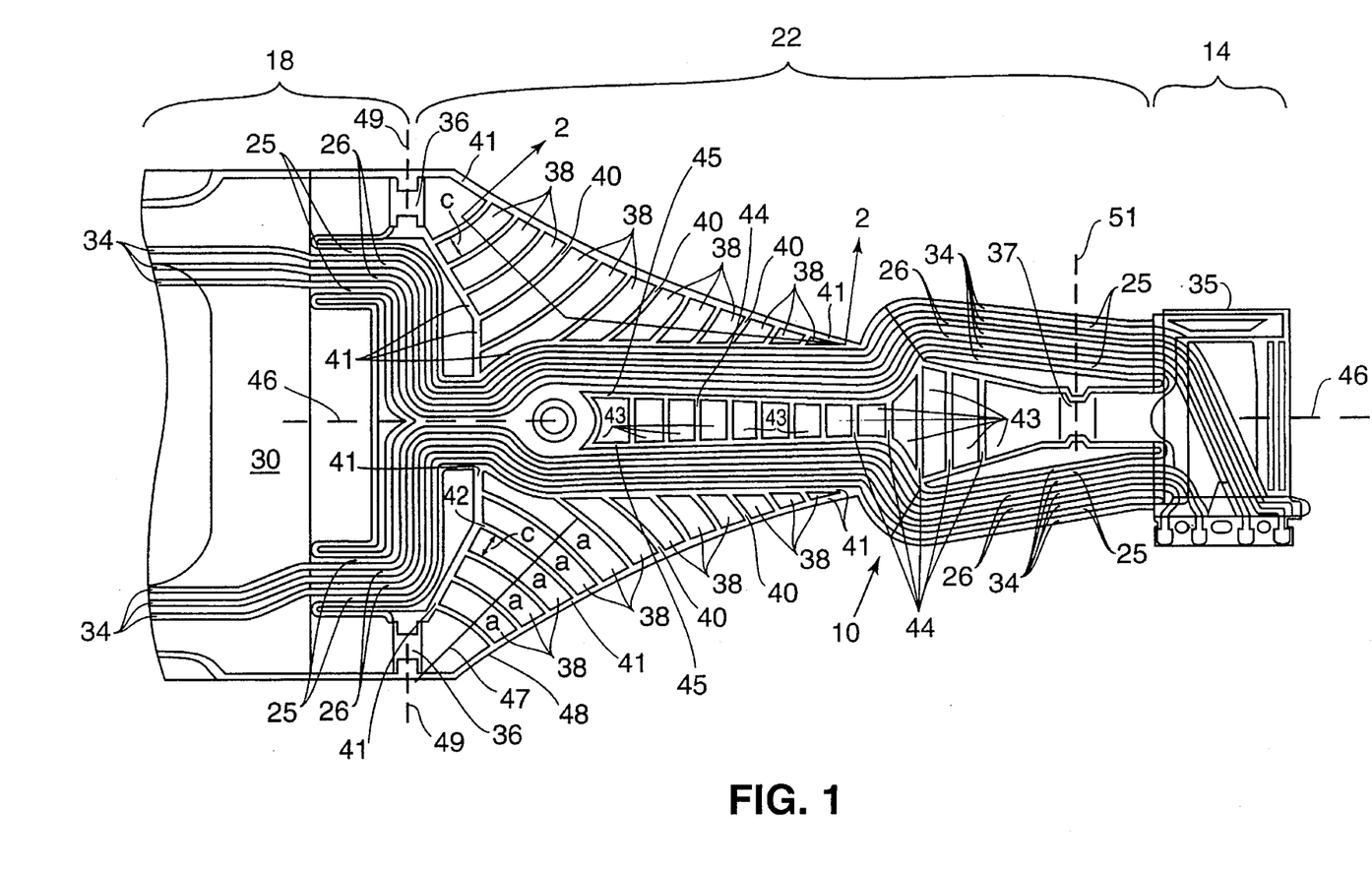
FIG. 1 is a top view of a slider suspension system according to the present invention.

FIG. 1 is a top view of a slider suspension system 10. The system 10 has a slider portion 14, an arm portion 18 and a link portion 22 (also referred to as a load beam). A plurality of signal guard lines 25 and electrical lines 26 are present on a surface 30 of the system 10. Each electrical line 26 has a space 34 positioned along each of its sides so as to prevent the electrical line 26 from shorting out with an adjacent electrical line 26 or guard line 25. Similarly, each signal guard line 25 has a space 34 positioned along each of its sides so as to prevent the guard line 25 from shorting out with an adjacent electrical line 26 or guard line 25. The signal guard lines 25 function to carry unwanted electrical signals to the ground circuit of the disk file. These unwanted electrical signals are produced by stray electromagnetic fields from the outside environment.

The portions 14, 18 and 22 designate regions of the system 10, but the system 10 is formed from one continuous piece of laminated material as is explained later with reference to FIG. 2.

The slider portion 14 is the part of the system 10 on which a read/write slider 35 is mounted. The read/write slider includes a transducer for reading and writing data on a medium such as a hard magnetic disk. The electrical lines 26 form the electrical connections for connecting the slider 35 to an external system as is explained later with respect to FIG. 5.

Figure 5:
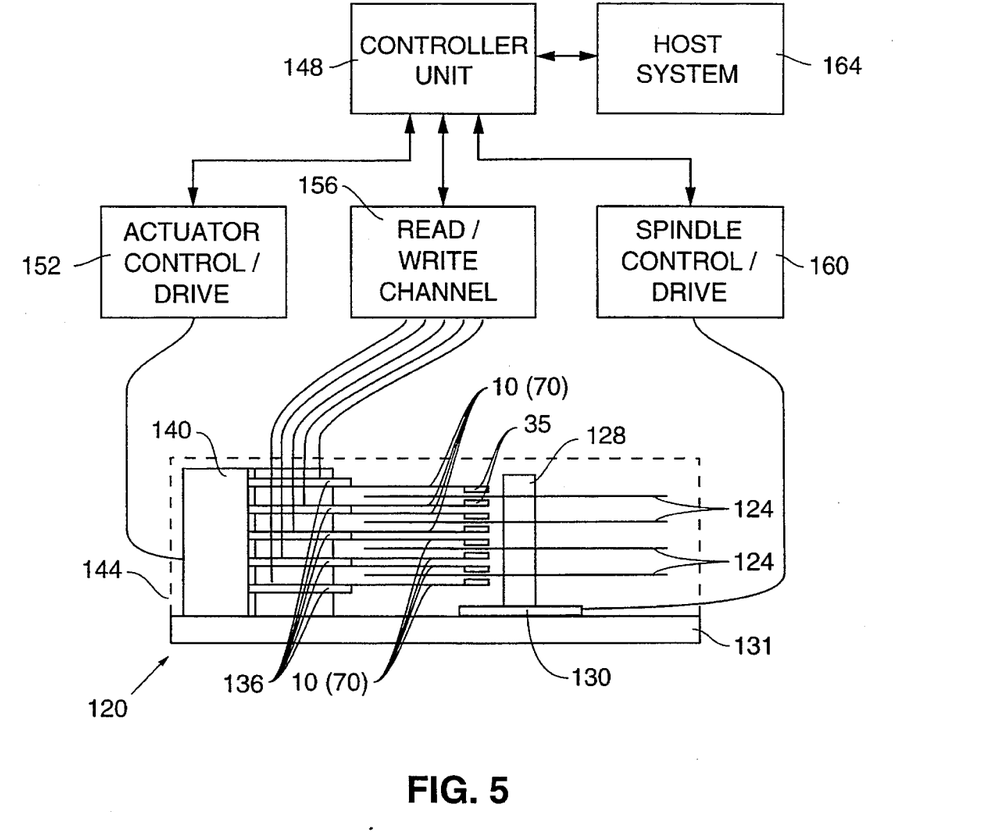
FIG. 5 is a schematic diagram of a disk file that utilizes the slider suspension system according to the present invention.

The arm portion 18 is the part of the system 10 that is connected to an actuator arm, such as the arm 136 shown in FIG. 5. Typically, the arm portion 18 is attached to the actuator arm by bonding the arm portion 18 to the actuator arm along the first layer 50 shown in FIG. 2.

A pair of hinges 36 are provided between the arm portion 18 and the link portion 22. Similarly, a hinge 37 is positioned at the end of the link portion 22 adjacent to the slider portion 14.

The link portion 22 includes a plurality of land areas 38, a plurality of spaces 40 and a plurality of spaces 41, positioned on the surface 30 in a pattern referred to as a "zebra" pattern. Each land area 38 is separated from each adjacent land area 38 by one of the spaces 40. The spaces 41 border the land areas 38 along each side of the land area 38 not surrounded by a space 40, so that each land area 38 is completely surrounded by a combination of the spaces 40 and 41.

The shape of the land areas 38 is not critical, but typically each land area 38 is a multisided enclosed region. As is shown in FIG. 1, some of the sides of the land area 38 can be curved. Other shapes such as circles, polygons, squares, rectangles and trapezoids could also be used for the land areas 38.

A second set of land areas 43 and spaces 44 and 45 are positioned about a centerline 46 which lies along the longitudinal axis of the system 10. Each land area 43 is a multisided enclosed region that is separated from each adjacent land area 43 by one of the spaces 44. The spaces 45 border the land areas 43 along each side of the land area 43 not surrounded by a space 44, so that each land area 43 is completely surrounded by a combination of the spaces 44 and 45.

In the preferred embodiment, some of the land areas 38 (labelled "a" in FIG. 1) are positioned about an axis 47 that passes near the anchor site 36 and bisects two or more of the land areas 38(*a*). Each of the land areas 38(*a*) are multisided regions that are slightly curved about the axis 47 and are surrounded on all sides by either the spaces 40 or the spaces 41. The land areas 38(*a*) have a width "c" measured along a line that perpendicularly bisects adjacent land areas 38 (i.e. in the direction of the axis 47). Also, in the preferred embodiment one of the spaces 41 runs along an edge 48 of the system 10. The spaces 40 intersect the space 41 that runs along the edge 48. An axis 49 runs through the two hinges 36 and is perpendicular to the centerline 46, and an axis 51 runs through the hinge 37 perpendicular to the centerline 46.

Figure 2:
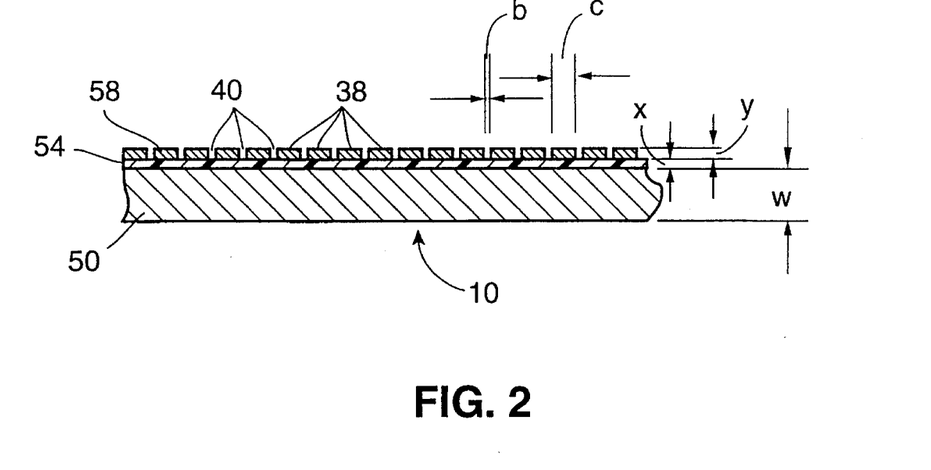
FIG. 2 is a cross-sectional view of the slider suspension system taken along the line 2—2 of FIG. 1.

FIG. 2 is a cross-sectional view of the slider suspension system 10 illustrating that the system 10 is a laminated structure comprised of a first layer 50, a second layer 54 and a third layer 58. The first layer 50 is positioned adjacent to one surface of the second layer 54. The third layer 58 is positioned adjacent to a different surface of the second layer 54 so that the second layer 54 separates the first layer 50 and the third layer 58, with the layers 50, 54 and 58 all lying in planes that are parallel to each other.

As can be seen in FIG. 2, the land areas 38 are regions of the third layer 58 that are roughly rectangular in cross section, and that are separated from each adjacent land area 38 by one of the spaces 40. The spaces 40 extend down to the second layer 54 so that the second layer 54 is exposed through the space 40.

Representative dimensions and compositions for the various elements illustrated in FIGS. 1 and 2 are as follows: The spaces 40 and 44 have a width "b" of approximately 0.05 to 0.1 millimeters. The land areas 38 and 43 have the width "c" of approximately 0.4 millimeters. The first layer 50 has a thickness "w" of approximately 0.051 millimeters and comprises a rigid material such as stainless steel. The second layer 54 has a thickness "x" of approximately 0.006 millimeters and comprises a viscoelastic dielectric material such as a polyimide. The third layer 58 has a thickness "y" of approximately 0.0127 millimeters and comprises an electrically conducting material such as a high strength beryllium copper alloy.

It should be appreciated that the values listed above are dependent on the particular pattern of the land areas 38 and 43, and spaces 40, 41, 44 and 45, and on the materials used in the layers 50, 54 and 58. For different systems, different values will need to be determined.

The land areas 38 and 43, and the electrical lines 26 and signal guard lines 25 are formed by etching the surface 30 using standard metal etching techniques. For example, when the third layer 58 comprises beryllium copper, the layer 58 is etched with ferric chloride. The etching process removes metal from specified regions, thereby forming the spaces 34, 40, 41, 44 and 45 that define the electrical lines 26, the signal guard lines 25 and the land areas 38 and 43.

With respect to the spaces 34, 40, 41, 44 and 45, metal from the third layer 58 is completely removed by the etching process leaving the second layer 54 exposed through the space 34, 40, 41, 44 or 45. In practice, a typical chemical etching process will not form a groove having the perfect rectangular shape illustrated in FIG. 2 for the spaces 40. Actual grooves formed by a chemical etching process are slightly rounded or tapered as is well-known in the art.

In the preferred embodiment, the first, second and third layers 50, 54 and 58 initially comprise a continuous sheet of laminated material of beryllium copper/polyimide/stainless steel laminate. A plurality of slider suspension systems 10 are then manufactured from the sheet of laminate. The preparation of metal-polyimide film laminates is described by St. Clair et al. in U.S. Pat. No. 4,543,295 (issued Sep. 24, 1985).

Figure 3:
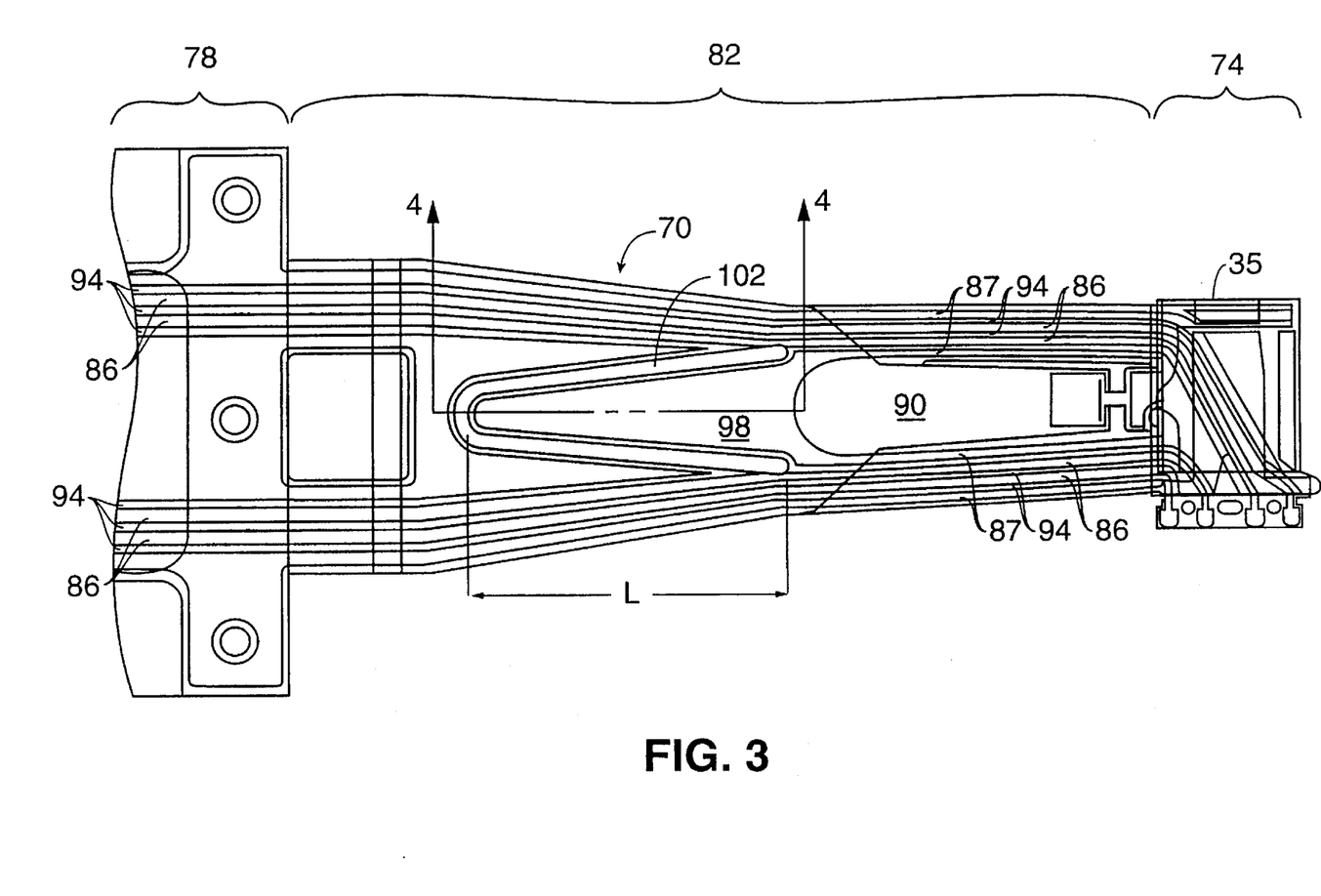
FIG. 3 is a top view of an alternative embodiment of a slider suspension system according to the present invention.

FIG. 3 is a top view of an alternative embodiment of a slider suspension system 70. The system 70 has a slider portion 74, an arm portion 78 and a link portion 82. A plurality of electrical lines 86 and signal guard lines 87 are present on a surface 90 of the system 70. Each electrical line 86 is separated from each adjacent electrical line or guard line 87 by a space 94 so as to prevent the electrical line 86 from shorting out with an adjacent electrical line 86 or guard line 87. Similarly, each signal guard line 87 has a space 94 positioned along each of its sides so as to prevent the guard line 87 from shorting out with an adjacent electrical line 86 or guard line 87. A V-shaped tongue 98, having a length "L," is formed on the surface 90 by cutting a V-shaped channel 102 around the perimeter of the tongue 98.

Figure 4:
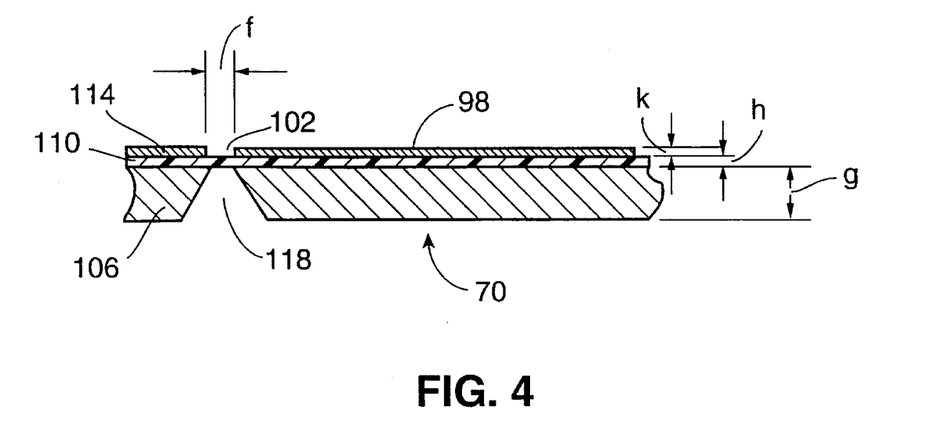
FIG. 4 is a cross-sectional view of the slider suspension system taken along the line 4—4 of FIG. 3.

FIG. 4 is a cross-sectional view of the slider suspension system 70 illustrating that the system 70 is a laminated structure comprised of a first layer 106, a second layer 110 and a third layer 114. The first layer 106 is positioned on one surface of the second layer 110. The third layer 114 is positioned on a different surface of the second layer 110 so that the second layer 110 separates the first layer 106 and the third layer 114, with the layers 106, 110 and 114 all lying in planes that are parallel to each other.

As can be seen in FIG. 4, the channel 102 is a region around the tongue 98 where the third layer 114 has been removed so that the second layer 110 is exposed. Also, a portion of the first layer 106 underneath the channel 102 is removed exposing the second layer 110 and forming a tapered channel 118. Thus, the second layer 110 is exposed on both sides of the channel 102. The channel 118 follows the shape of the channel 102 all around the perimeter of the tongue 98 and so also has the V-shape of the channel 102.

Representative dimensions and compositions for the various elements illustrated in FIGS. 3 and 4 are as follows: The channel 102 has a width "f" of approximately 0.4 millimeters and the length "L" is approximately 6.3 millimeters. The layers 106, 110 and 114 are analogous to the layers 50, 54 and 58 and have the same dimensions and compositions so that the first layer 106 has a thickness "g" of approximately 0.051 millimeters and comprises a rigid material such as stainless steel. The second layer 110 has a thickness "h" of approximately 0.006 millimeters and comprises a viscoelastic dielectric material such as a polyimide. And the third layer 114 has a thickness "k" of approximately 0.0127 millimeters and comprises an electrically conducting material such as a beryllium copper alloy.

It should be appreciated that the values listed above are dependent on the particular pattern of the tongue 98 and channels 102 and 118, and on the materials used in the layers 106, 110 and 114. For different systems, different values will need to be determined.

The tongue 98 and the electrical lines 86 and guard lines 87, are formed by etching the surface 90 using standard metal etching techniques as was discussed previously with respect to the suspension system 10. The etching process removes metal from specified regions, thereby forming the spaces 94 and the channel 102 that define the electrical lines 86, guard lines 87 and the tongue 98.

With respect to both the spaces 94 and the channel 102, metal from the third layer 114 is completely removed by the etching process leaving the second layer 110 exposed through the spaces 94 or the channel 102. The channel 118 is also formed by chemical etching. The channel 118 has a tapered shape (i.e. it is wider at its bottom then it is adjacent to the second layer 110) because of the etching process. When a thick layer of metal, such as the layer 106 is etched, the resulting groove typically has a slight tapered shape.

FIG. 5 is a schematic diagram of a magnetic recording disk file 120 that utilizes the slider suspension systems 10 or 70 of the present invention. It should be appreciated that the suspension systems 10 and 70 could also be used with other data storage systems that require a vibration minimizing transducer suspension system, such as floppy disk drives, optical drives or compact disk players.

The disk file 120 comprises a plurality of magnetic recording disks 124 suitable for use in hard disk drives. The disks 124 are mounted on a spindle shaft 128 which is connected to a spindle motor 130. Motor 130 is mounted to a chassis 131.

The plurality of read/write sliders 35 are positioned over the disks 124 such that each disk 124 can be accessed by one of the sliders 35. Each of the sliders 35 includes a transducer for reading and writing data on a plurality of concentric data tracks on the disks 124 and are attached to one of the suspension systems 10 (or 70). Each of the suspension systems 10 (or 70) are attached to an actuator arm 136 which is attached to a rotary actuator 140. The rotary actuator 140 moves the actuator arm 136 (and hence the suspension system 10 or 70 and the slider 35) in a radial direction across the disk 124. An enclosure 144 (shown by a dashed line in FIG. 5) seals the disk file 120 and provides protection from particulate contamination.

A controller unit 148 provides overall control to the system 120. The controller unit 148 contains a central processing unit (CPU), memory unit and other digital circuitry and is connected to an actuator control/drive unit 152 which in turn is electrically connected to the actuator 140. This allows the controller 148 to control the movement of the sliders 35 over the disks 124. The controller 148 is electrically connected to a read/write channel 156 which in turn is electrically connected to the sliders 35. This allows the controller 148 to send and receive data from the disks 124. The controller 148 is electrically connected to a spindle control/drive unit 160 which in turn is electrically connected to the spindle motor 130. This allows the controller 148 to control the rotation of the disks 124. A host system 164, which is typically a computer system, is electrically connected to the controller unit 148. The host system 164 may send digital data to the controller 148 to be stored on the disks 124, or may request that digital data be read from the disks 124 and sent to the system 164. The basic operation and structure of data storage systems, such as the disk file 120 (without the suspension systems 10 or 70), is well-known in the art and is described in more detail in *Magnetic Recording Handbook*, C. Dennis Mee and Eric D. Daniel, McGraw-Hill Book Company (1990).

Referring now to FIG. 5, the problem addressed by the present invention can be explained. The vibration of the arms 136 and the suspension system 10 (or 70) in the disk file 120 produces the undesirable effect of increasing the nonrepeatable run out (NRRO) of the recording element of the sliders 35. This effect limits the track density and capacity of the disk file 120.

In the disk file 120, the vibration of the arms 136 and suspension system 10 is excited by the vibration of the disk spindle 128, the motion of the actuator 140 and particularly the air flow inside the enclosure 144. The amplitude of the vibration and, therefore, the NRRO amplitude, is proportional to the degree of excitation. Additionally, the frequency content of the excitation source is of importance. If an excitation frequency is close to a suspension assembly natural frequency, the amplitude of vibration will be inversely proportional to the amount of damping. A system with very small damping in a particular mode will have a large amplitude if some driving frequency lies close to its natural frequency. Usually the air flow excites all frequencies of the suspension 10 (or 70). Then, to lower the NRRO, it is desirable to have high damping particularly in the modes that have significant contribution the NRRO. It is also desirable to have a design with high natural frequencies and rigidity, with low coupling between the suspension and slider motion and less sensitivity to the excitation source.

Referring now to FIGS. 1 and 2, the functioning of the preferred embodiment of the present invention can be explained. The suspension system 10 is comprised of the three layers 50, 54 and 58. The first layer 50 is a stiffener layer that gives rigidity to the system 10 and is the structure that needs to be damped. The second layer 54 is a constrained layer that is constrained by the third layer 58. The second layer 54 is comprised of a polyimide dielectric material that functions as an electrical insulator between the first layer 50 and the third layer 58, and that also has viscoelastic properties. Viscoelastic means that the stress in a deformed material is proportional to both the deformation and the rate of deformation. Viscoelastic materials also exhibit creep and relaxation behavior. Creep means that under constant stress the deformation increases in time. Relaxation means that under constant fixed deformation the stress decreases steadily in time.

The third layer 58 is comprised of an electrically conducting material, such as a high strength copper alloy like beryllium copper. The third layer 58 is preferably comprised of copper because the electrical lines 26 need to function as efficient electrical conductors. The alloy is preferably high strength because the high modulus provides high stiffness which enhances the constraining layer's ability to transfer strain energy into the second layer 54. Also, the hinges 36 and 37 carry the preload applied to the slider 35 and thus undergo high stress. Additionally, such alloys are more stable under stress which means preload is not lost.

The pattern of the land areas 38 and 43 and the spaces 40, 41, 44 and 45 functions to dampen the bending modes of the suspension system 10 by providing regions in which the second layer 54 can undergo shear. When the suspension system 10 undergoes bending vibrations, the material of the first layer 50 undergoes cyclic deformation. Since the second layer 54 is bonded to the first layer 50, this deformation is transmitted into the bottom surface of the material comprising the second layer 54.

In regions where the second layer 54 is covered by a land area 38, the top surface of the second layer 54 is constrained from deforming beyond what the stiffness of land area 38 allows. Therefore, layer 54 is sheared across its thickness. Shear motion inside the layer 54 absorbs energy of the system thereby damping the modal motion of the suspension system.

The function of the spaces 40 and 44 is to maintain the width "c" of the land areas 38 and 43 at some optimum value. For example, if the spaces 40 and 44 did not exist, the width "c" would be large and the land areas 38 and 43, respectively, would become too flexible to function efficiently as a constraining layer. On the other hand, if the width "c" of the land areas 38 and 43 is too narrow, the region covered by these land areas would be small and no constraining effect would exist. In either case, less damping would occur. Basically, the width "b" of the spaces 40 is chosen to be as narrow as possible while still maintaining a discrete separation between adjacent land areas 38.

The "zebra" pattern of land areas 38 depicted in FIG. 1 is aimed at damping the bending and torsional modes of the suspension system 10. To damp these modes, some of the land areas 38 are positioned about the axis 47 which runs perpendicular to the curvature of the land areas 38, and passes close to one of the hinges 36. This orientation presents the optimized land width "c" to the maximum amount of deformation.

In the land areas 38 and 43, the width "c" is optimized to produce the highest damping. If the width "c" is too large, the land areas 38 will be stretched by the second layer 54. On the other hand, if the width "c" is too small, very little of the second layer 54 will be constrained. In either of these cases, the amount of damping obtained will be smaller than is possible with some optimized value for the width "c."

An approximate technique for determining an optimum value for the width "c" utilizes equation 1 below where $E_s$=elastic modulus of copper=$1.279 \times 10^8$; $E_1$=viscous modulus of polyimide=$1.2 \times 10^6$; x=second layer thickness= 0.006 mm; y=third layer width=0.0127 mm; and v=Poisson modulus of polyimide=0.34:

$$c = 4.64 \sqrt{(1 + v) x y E_s/E_1} = .3 \text{ mm} \quad (1)$$

Once an approximate value for the width "c" has been calculated, the width "c" can be optimized by constructing prototype systems 10 and measuring the amount of damping obtained for various configurations. Generally, the width "c" is in the range of 0.1 to 0.8 mm.

Referring to FIGS. 1 and 5, the pair of hinges 36 are provided between the arm portion 18 and the link portion 22 to allow link portion 22 to pivot around axis 49 and thus allow the slider 35 and the slider portion 14 to closely follow disk runout without disturbing flying height between slider 35 and disk 124. The hinges 36 are part of the third layer 58 and are positioned along axis 49 to produce a preload on slider 35. This preload forces the slider against the disk 124 and is balanced by the air bearing force produced by the rotation of disk spindle 128 that tends to separate the slider 35 from the disk 124. The portions of the electrical lines 26 and guard lines 25 located between the hinges 36 and arm portion 18 and link portion 22 is flexible enough so that they do not affect the angle of hinges 36. Furthermore, the bending stiffness of the link portion 22 around the axis 49 depends mostly on the hinges 36.

The hinge 37 allows the slider portion 14 to pitch around the axis 46 and roll around the axis 51. The portions of electrical lines 26 and guard lines 25 located on both sides of hinge 37 and between link portion 22 and slider portion 14, are flexible enough to make the bending stiffness of the slider portion 14 around the axes 46 and 51 mostly dependent on the stiffness of hinge 37. The length and width of hinges 36 and 37 are appropriately chosen to provide the slider portion 14 with adequate stiffness in bending and displacement away from its plane, thus making the slider 35 fly at the desired flying height and keeping it as constant as possible. Dynamic response and natural frequencies of the suspension are also determined by the hinge stiffnesses.

Referring, to FIGS. 3 and 4, the functioning of the alternative embodiment can be explained. During operation of a disk drive, the bending and torsional modes of the suspension system 70 cause the system 70 to bend and twist. However, the shape of the tongue 98 allows it to remain relatively flat during this motion, thereby causing the part of the second layer 110 that lies under the tongue 98 to undergo stretching and shearing motions. A narrow width "f" favors shear in the second layer 110 while a wider width "f" produces more stretching.

An approximate technique for determining an optimum value for the length "L" utilizes equation 2 below where f=0.4 mm:

$$L = 1.204 \sqrt[4]{1/3 \, E_s/E_1 \, (y/x)^3 b_s f^3 [1 + 2.4(1 + v) \, (x/y)^2]} = 6.3 \quad (2)$$

Once an approximate value for the length "L" has been calculated, "L" can be optimized by constructing prototype systems 70 and measuring the amount of damping obtained for various configurations to yield an optimized value. Generally, a short length "L" will produce little damping, but a longer length "L" will deteriorate the suspension dynamics of the system 70.

The V-shape of the tongue 98 is chosen because this will minimize the reduction in stiffness in the suspension system 70 while giving maximum stiffness to the tongue 98. The maximum stiffness in the tongue 98 and suspension system 70 is achieved when each of these elements have the widest base possible.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A suspension system for supporting a data transducer comprising:

a laminated section comprised of a first layer comprised of a metal, a second layer comprised of a dielectric material and positioned over the first layer, and a third layer comprised of an electrically conducting material and positioned over the second layer;

a first land area formed on the laminated section consisting of a four-sided region of the third layer, the first land area having a width c measured between two opposite sides of the first land area, the first land area constraining a first region of the second layer positioned underneath the first land area so that shearing occurs in the first region in response to deformation in the second layer;

a second land area formed on the laminated section consisting of a four-sided region of the third layer, the second land area having a width d measured between two opposite sides of the second land area, the second land area constraining a second region of the second layer positioned underneath the second land area so that shearing occurs in the second region in response to deformation in the second layer;

a third land area formed on the laminated section consisting of a four-sided region of the third layer, the third land area having a width e measured between two opposite sides of the third land area, the third land area constraining a third region of the second layer positioned underneath the third land area so that shearing occurs in the third region in response to deformation in the second layer, with the width c, the width d and the width e all lying parallel to a straight line which intersects the first land area, the second land area and the third land area;

a first channel formed on the laminated section completely surrounding the first land area and isolating the first land area from any other part of the third layer so as to enhance the ability of the first land area to constrain the first region, the first channel extending through the third layer and exposing the second layer;

a second channel formed on the laminated section completely surrounding the second land area and isolating the second land area from any other part of the third layer so as to enhance the ability of the second land area to constrain the second region, the second channel extending through the third layer and exposing the second layer; and a third channel formed on the laminated section completely surrounding the third land area and isolating the third land area from any other part of the third layer so as to enhance the ability of the third land area to constrain the third region, the third channel extending through the third layer and exposing the second layer.

2. The suspension system of claim 1 wherein the width c, the width d and the width e are each in the range of approximately 0.3 to 0.8 millimeters.

3. The suspension system of claim 1 wherein the width c, the width d and the width e are each in the range of approximately 0.1 to 0.8 millimeters.

4. The suspension system of claim 1 wherein the first layer comprises a stainless steel, the second layer comprises a polyimide and the third layer comprises a copper alloy.

5. The suspension system of claim 1 wherein the first, second and third land areas each comprise a solid region of the third layer.

6. A suspension system for supporting a read/write transducer in a disk drive comprising:

a laminated section comprised of a first layer comprised of a metal, a second layer comprised of a dielectric material and positioned over the first layer, and a third layer comprised of an electrically conducting material and positioned over the second layer;

a first land area formed on the laminated section and comprising a multisided region of the third layer surrounded on all sides by a plurality of spaces that extend through the third layer and expose the second layer, the first land area having a width c in the range of 0.3 to 0.8 mm, the first land area constraining a first region of the second layer positioned underneath the first land area so that shearing occurs in the first region in response to deformation in the second layer;

a second land area formed on the laminated section and comprising a multisided region of the third layer surrounded on all sides by a plurality of spaces that extend through the third layer and expose the second layer, the second land area having a width d in the range of 0.3 to 0.8 mm, the second land area constraining a second region of the second layer positioned underneath the second land area so that shearing occurs in the second region in response to deformation in the second layer;

a third land area formed on the laminated section and comprising a multisided region of the third layer surrounded on all sides by a plurality of spaces that extend through the third layer and expose the second layer, the third land area having a width e in the range of 0.3 to 0.8 mm, the third land area constraining a third region of the second layer positioned underneath the third land area so that shearing occurs in the third region in response to deformation in the second layer;

a first channel formed on the laminated section separating the first land area and the second land area, the first channel extending through the third layer and exposing the second layer;

a second channel formed on the laminated section separating the second land area and the third land area, the second channel extending through the third layer and exposing the second layer, the width d of the second land area extending from the first channel to the second channel;

a third channel formed on the laminated section and positioned adjacent to a first edge of the first land area, a first edge of the second land area and a first edge of the third land area, the third channel intersecting the first channel and the second channel and extending through the third layer and exposing the second layer;

a fourth channel formed on the laminated section and positioned adjacent to a second edge of the first land area, a second edge of the second land area and a second edge of the third land area, the fourth channel intersecting the first channel and the second channel and extending through the third layer and exposing the second layer;

a fifth channel formed on the laminated section and separating the first land area from any other part of the third layer, the fifth channel extending through the third layer and exposing the second layer, the width c of the first land area extending across the first land area in a direction parallel to the width d; and a sixth channel formed on the laminated section and separating the third land area from any other part of the third layer, the sixth channel extending through the third layer and exposing the second layer, the width e of the third land area extending across the third land area in a direction parallel to the width d.

7. The suspension system of claim 6 wherein the third layer is comprised of a copper alloy, the second layer is comprised of a polyimide and the first layer is comprised of a stainless steel.

8. The suspension system of claim 6 wherein the fourth channel extends along an outside edge of the laminated section.

9. The suspension system of claim 6 wherein the width c, the width d and the width e are aligned parallel to an axis of a bending or torisional mode.

10. The suspension system of claim 6 wherein the first, second and third land areas each comprise a solid region of the third layer.

11. A suspension system for supporting a read/write slider in a disk drive comprising:

a laminated section comprised of a first layer comprised of a metal, a second layer comprised of a dielectric material and positioned over the first layer, and a third layer comprised of an electrically conductive material and positioned over the second layer;

a read/write slider attached to a first end of the laminated section;

a first land area formed on the laminated section and comprising a multisided region of the third layer surrounded on all sides by a plurality of spaces that extend through the third layer and expose the second layer, the first land area having a width c in the range of 0.3 to 0.8 mm, the first land area constraining a first region of the second layer positioned underneath the first land area so that shearing occurs in the first region in response to deformation in the second layer;

a second land area formed on the laminated section and comprising a multisided region of the third layer surrounded on all sides by a plurality of spaces that extend through the third layer and expose the second layer, the second land area having a width d in the range of 0.3 to 0.8 mm, the second land area constraining a second region of the second layer positioned underneath the second land area so that shearing occurs in the second region in response to deformation in the second layer;

a third land area formed on the laminated section and comprising a multisided region of the third layer surrounded on all sides by a plurality of spaces that extend through the third layer and expose the second layer, the third land area having a width e in the range of 0.3 to 0.8 mm, the third land area constraining a third region of the second layer positioned underneath the third land area so that shearing occurs in the third region in response to deformation in the second layer;

a first channel formed on the laminated section separating the first land area and the second land area, the first channel extending through the third layer and exposing the second layer;

a second channel formed on the laminated section separating the second land area and the third land area, the second channel extending through the third layer and exposing the second layer, the width d of the second land area extending from the first channel to the second channel;

a third channel formed on the laminated section and positioned adjacent to a first edge of the first land area, a first edge of the second land area and a first edge of the third land area, the third channel intersecting the first channel and the second channel and extending through the third layer and exposing the second layer;

a fourth channel formed on the laminated section and positioned adjacent to a second edge of the first land area, a second edge of the second land area and a second edge of the third land area, the fourth channel intersecting the first channel and the second channel and extending through the third layer and exposing the second layer;

a fifth channel formed on the laminated section and separating the first land area from any other part of the third layer, the fifth channel extending through the third layer and exposing the second layer, the width c of the first land area extending across the first land area in a direction parallel to the width d; and a sixth channel formed on the laminated section and separating the third land area from any other part of the third layer, the sixth channel extending through the third layer and exposing the second layer, the width e of the third land area extending across the third land area in a direction parallel to the width d.

12. A disk drive including the suspension system of claim 11 further comprising:

a data storage medium accessible by the read/write slider; and an actuator connected to a second end of the laminated section for moving the laminated section relative to the data storage medium.

13. The suspension system of claim 11 wherein the first, second and third land areas are four-sided regions.

14. The suspension system of claim 11 wherein the first layer comprises a stainless steel, the second layer comprises a polyimide and the third layer comprises a copper alloy.

15. The suspension system of claim 11 wherein the first, second and third land areas each comprise a solid region of the third layer.

* * * * *